(12) United States Patent
Chen et al.

(10) Patent No.: US 8,937,394 B2
(45) Date of Patent: Jan. 20, 2015

(54) COMPOUND BARRIER LAYER, METHOD FOR FORMING THE SAME AND PACKAGE STRUCTURE USING THE SAME

(71) Applicant: Industrial Technology Research Institute, Hsinchu (TW)

(72) Inventors: Chun-Ting Chen, Bade (TW); Li-Wen Lai, Taichung (TW); Kun-Wei Lin, Tainan (TW); Teng-Yen Wang, Beigang Township (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/728,544

(22) Filed: Dec. 27, 2012

(65) Prior Publication Data
US 2014/0054803 A1   Feb. 27, 2014

(30) Foreign Application Priority Data
Aug. 24, 2012 (TW) .............................. 101130751 A

(51) Int. Cl.
*H01L 23/29* (2006.01)
*H01L 23/31* (2006.01)
(Continued)

(52) U.S. Cl.
CPC ............ *H01L 23/3135* (2013.01); *H01L 21/56* (2013.01); *H01L 51/0097* (2013.01); *H01L 51/5256* (2013.01); *H01L 2924/0002* (2013.01); *H01L 23/3192* (2013.01)
USPC ............... 257/790; 257/40; 257/79; 257/787; 438/127; 438/36

(58) Field of Classification Search
USPC ................... 257/40, 98, 72, 774, 77, 75, 642, 257/E27.111, E51.001, E51.018, E21.134, 257/E21.24, E21.413, E21.499, E21.567, 257/E23.194, E29.002, E29.278, E29.293, 257/E51.022, E51.027, 448, 52, 59, 643, 257/779, 790; 438/32, 35, 40, 404, 42, 455, 438/46, 460.481, 627, 99, 127, 19, 27, 36, 438/458, 653, 763; 313/504, 506, 500, 501, 313/502, 503, 505, 512
See application file for complete search history.

(56) References Cited

U.S. PATENT DOCUMENTS

| | | | |
|---|---|---|---|
| 6,268,695 B1 * | 7/2001 | Affinito | ........................ 313/504 |
| 6,866,901 B2 | 3/2005 | Burrows et al. | |

(Continued)

FOREIGN PATENT DOCUMENTS

TW    I222764    10/2004

OTHER PUBLICATIONS

Carcia et al., "Gas diffusion ultrabarriers on polymer substrates using Al2O3 atomic layer deposition and SiN plasma-enhanced chemical vapor deposition," Journal of Applied Physics, vol. 106, No. 023533, 2009, pp. 1-6.
Chen et al., "Improvements of Permeation Barrier Coatings Using Encapsulated Parylene Interlayers for Flexible Electronic Applications," Plasma Processes and Polymers, vol. 4, 2007, pp. 180-185.
(Continued)

*Primary Examiner* — Colleen A Matthews
*Assistant Examiner* — Junaiden Mirsalahuddin
(74) *Attorney, Agent, or Firm* — Birch, Stewart, Kolasch & Birch, LLP

(57) ABSTRACT

An embodiment of the invention provides a compound barrier layer, including: a first barrier layer disposed on a substrate; and a second barrier layer disposed on the first barrier layer, wherein the first barrier layer and second barrier layer both include a plurality of alternately arranged inorganic material regions and organo-silicon material regions and the inorganic material regions and the organo-silicon material regions of the first barrier layer and second barrier layer are alternatively stacked vertically.

19 Claims, 10 Drawing Sheets

(51) Int. Cl.
*H01L 21/56* (2006.01)
*H01L 51/00* (2006.01)
*H01L 51/52* (2006.01)

(56) References Cited

U.S. PATENT DOCUMENTS

| | | |
|---|---|---|
| 7,074,501 B2 | 7/2006 | Czeremuszkin et al. |
| 7,342,356 B2 | 3/2008 | McCormick et al. |
| 2003/0203210 A1 | 10/2003 | Graff et al. |
| 2007/0196682 A1 | 8/2007 | Visser et al. |
| 2008/0121916 A1 | 5/2008 | Teng et al. |
| 2010/0155709 A1* | 6/2010 | Hack et al. ............... 257/40 |
| 2011/0049491 A1* | 3/2011 | De Vries et al. ......... 257/40 |
| 2011/0260147 A1* | 10/2011 | Kim et al. ............... 257/40 |

OTHER PUBLICATIONS

Chiang et al., "Deposition and permeation properties of SiNx/parylene multilayers on polymeric substrates," Surface & Coatings Technology, vol. 200, 2006, pp. 5843-5848.

Chwang et al., "Thin film encapsulated flexible organic electroluminescent displays," Applied Physics Letters, vol. 83, No. 3, Jul. 21, 2003, pp. 413-415.

Lewis et al., "Thin-Film Permeation-Barrier Technology for Flexible Organic Light-Emitting Devices," IEEE Journal of Selected Topics in Quantum Electronics, vol. 10, No. 1, Jan./Feb. 2004, pp. 45-57.

Ogawa et al., "Protection of organic light-emitting diodes over 50 000 hours by Cat-CVD SiNx/SiOxNy stacked thin films," Thin Solid Films, vol. 516, 2008, pp. 611-614.

* cited by examiner

COMPOUND BARRIER LAYER, METHOD FOR FORMING THE SAME AND PACKAGE STRUCTURE USING THE SAME

CROSS REFERENCE TO RELATED APPLICATIONS

This application claims priority of Taiwan Patent Application No. 101130751, filed on Aug. 24, 2012, the entirety of which is incorporated by reference herein.

TECHNICAL FIELD

The technical field relates to a barrier layer, and in particular, relates to a compound barrier layer, method for forming the same and package structure using the same.

BACKGROUND

As technology develops, techniques for soft electronic devices have grown. Widely applications of an organic light emitting diode (OLED) because of its self-luminous capability, light weight, thin size, and low power consumption, and therefore, OLEDs are expected to replace fluorescent lamps. In addition, the light emitting materials of OLEDs are flexible organic material, and are having a high contrast ratio, short response time, wide viewing angles, etc., and can be used for manufacturing a flexible organic light emitting diode display having a soft panel to replace the conventional rigid display.

In general, polymers of organic light emitting layer and electrode materials (such as Ca, Mg, or the like) in a organic light emitting diode display are sensitive to water and oxygen. Therefore, if water/oxygen in the air penetrates through the substrate, the device would be damaged. Therefore, it is a trend to develop water-resistant and oxygen-resistant techniques.

SUMMARY

An embodiment of the disclosure provides a compound barrier layer, including: a first barrier layer disposed on a substrate; and a second barrier layer disposed on the first barrier layer, wherein the first barrier layer and second barrier layer both include a plurality of alternately arranged inorganic material regions and organo-silicon material regions, wherein the inorganic material regions of the first barrier layer and the organo-silicon material regions of the second barrier layer are alternatively stacked vertically, and the inorganic material regions of the second barrier layer and the organo-silicon material regions of the first barrier layer are alternatively stacked vertically.

An embodiment of the disclosure provides a package structure containing the compound barrier layer, including: a substrate; an electronic device disposed on the substrate; and a first compound barrier layer disposed on the electronic device, wherein the first compound barrier layer comprises: a first barrier layer disposed on the electronic device; and a second barrier layer disposed on the first barrier layer, wherein the first barrier layer and second barrier layer both include a plurality of alternately arranged inorganic material regions and organo-silicon material regions, wherein the inorganic material regions of the first barrier layer and the organo-silicon material regions of the second barrier layer are alternatively stacked vertically, and the inorganic material regions of the second barrier layer and the organo-silicon material regions of the first barrier layer are alternatively stacked vertically.

An embodiment of the disclosure provides a method for manufacturing a compound barrier layer, including: providing a substrate; forming a first barrier layer on the substrate; and forming a second barrier layer on the first barrier layer, wherein the first barrier layer and the second barrier layer both comprise a plurality of alternately arranged inorganic material regions and organo-silicon material regions, wherein the inorganic material regions of the first barrier layer and the organo-silicon material regions of the second barrier layer are alternatively stacked vertically, and the inorganic material regions of the second barrier layer and the organo-silicon material regions of the first barrier layer are alternatively stacked vertically.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
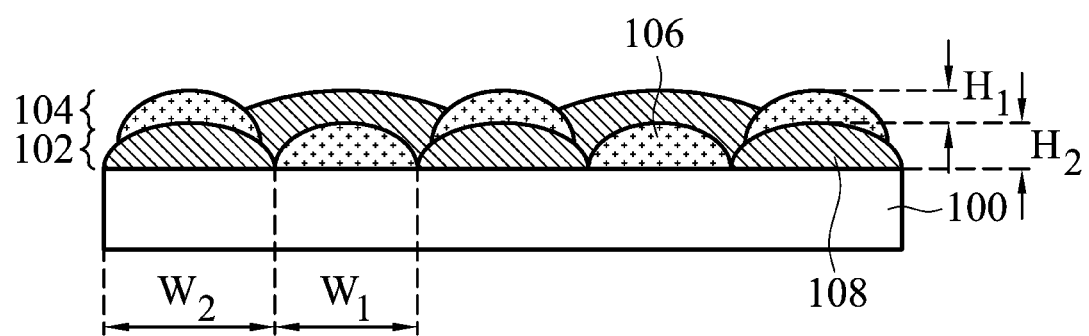
FIG. 1 illustrates a cross section of a compound barrier layer according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to an embodiment of the disclosure, a compound barrier layer is provided. Discontinuous inorganic material regions are arranged alternatively (each region separates from one another) in the compound barrier layer, and organo-silicon material regions are used to separate each inorganic material region, such that a compound barrier layer having water-resistant ability and oxygen-resistant ability is formed.

FIG. 1 illustrates a cross section of a compound barrier layer according to an embodiment of the disclosure. In FIG. 1, a compound barrier layer comprises a substrate 100, a first barrier layer 102, and a second barrier layer 104. The first barrier layer 102 locates on the substrate 100. The second barrier layer 104 is disposed on the first barrier layer 102. As shown in FIG. 1, the first barrier layer 102 and second barrier layer 104 both comprise a plurality of alternately arranged inorganic material regions 106 and organo-silicon material regions 108 and the inorganic material regions 106 and the organo-silicon material regions 108 are alternatively stacked vertically.

According to an embodiment of the disclosure, the substrate 100 may be a flexible substrate. Examples of the substrate may be, but are not limited to, a poly(ethylene terephthalate) (PET) substrate, a polyethersulfones (PES) substrate, a poly(ethylene 2,6-naphthalate) (PEN) substrate, a polyimide (PI) substrate, or a polycarbonate (PC) substrate. In another embodiment, the substrate 100 may be a rigid substrate, such as glass, or other appropriate substrates.

The inorganic material regions 106 may comprise, for example, aluminum oxide ($Al_2O_3$), silicon oxide, silicon oxynitride, silicon nitride, silicon-carbon-oxy-nitride ($SiC_xO_yN_z$; x=1-3, y=1-3, and z=1-3), or combinations thereof. A width $W_1$ of the inorganic material regions 106 may be between 0.5 mm and 20 mm, for example. A height $H_1$ of the inorganic material regions 106 may be between 50 nm and 500 nm, for example. The organo-silicon material regions 108 may comprise compounds having a bonding between silicon and carbon (Si—C bond) or a bonding of silicon-oxygen-carbon (Si—O—C bond). Examples for the compounds having an Si—C bond may include, but are not limited to, organo-silicon compounds having an Si—($CH_3$) bond, Si—($CH_2$) bond, or Si—(CH) bond. A width $W_2$ of the organo-silicon material regions 108 may be between 0.5 mm and 20 mm, for example. A height $H_2$ of the organo-silicon material regions 108 may be between 50 nm and 500 nm, for example. The width $W_1$ of the inorganic material regions 106 may be smaller than the width $W_2$ of the organo-silicon material regions 108. However, it should be understood that sizes of the inorganic material regions 106 and organo-silicon material regions 108 may be adjusted according to application. For example, when the compound barrier layer is used in a flexible device, the sizes of the inorganic material regions 106 and organo-silicon material regions 108 may be adjusted according to the curvature radius of the device. In general, the higher the curvature radius is, the smaller the width of the inorganic material regions 106 should be, such that the inorganic material regions 106 may not break or crack because of bending. For example, the width of the inorganic material regions 106 may be smaller than the curvature radius of the device.

In addition, as shown in FIG. 1, in the compound barrier layer according to an embodiment of the disclosure, the organo-silicon material regions 108 of the first barrier layer 102 and the second barrier layer 104 are connected to each other to form a continuous structure, and the inorganic material regions 106 of the first barrier layer 102 and the second barrier layer 104 are disconnected with each other to form a discontinuous structure. In general, inorganic material with a continuous structure may have a good water-resistant ability. However, the hardness of the continuous inorganic material structure is high, and therefore, when the continuous inorganic material structure is used in a flexible device, the continuous inorganic material structure may break when being bent and water may penetrate the device through the broken cracks. However, in the compound barrier layer as shown in FIG. 1, the inorganic material regions 106 are arranged to be separated by the organo-silicon material regions 108 (in other words, the inorganic material regions and the organo-silicon material regions of the first barrier layer and second barrier layer are alternatively stacked between each other), such that it can prevent the device from water penetration, whether the water comes from the main surface or side surfaces. Furthermore, since the inorganic material regions 106 are arranged to be a discontinuous structure separated from each other, the problem of the continuous inorganic material structure, which may break when being bent, can be prevented.

In addition, compared to conventional organic materials, the organo-silicon material regions 108 have a good water-resistant ability (for example, <0.01 $g/m^2/day$). Therefore, when the organo-silicon material regions 108 are used to separate the inorganic material regions 106, the compound barrier layer can still maintain a good water-resistant ability. Moreover, the organo-silicon material regions 108 can also release the stress in the structure. Therefore, curving stress may be absorbed by organo-silicon material regions 108 so that the barrier layer does not break when being bent. According to an embodiment of the disclosure, the compound barrier layer containing inorganic material regions 106 and organo-silicon material regions 108 has a water vapor transmission rate (WVTR) less than about $5 \times 10^{-3}$ $g/m^2/day$.

Figure 2:
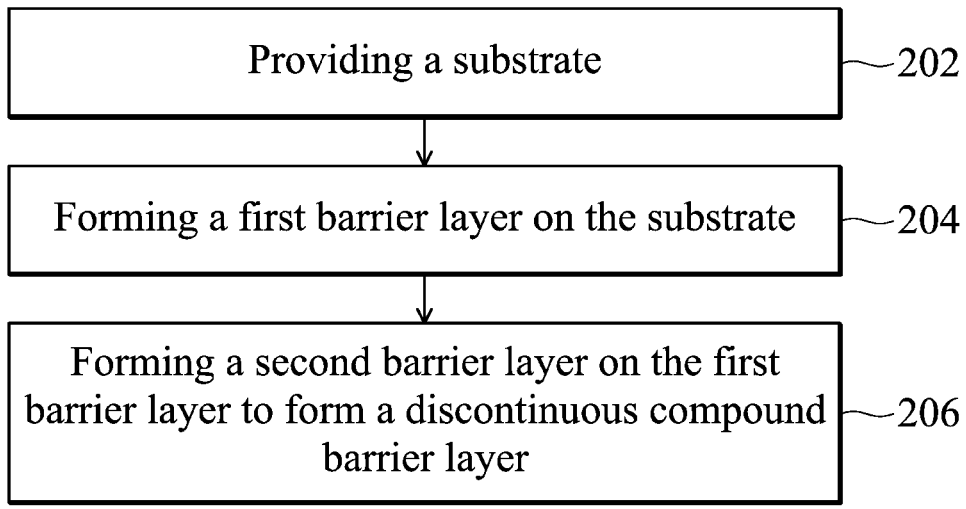
FIG. 2 illustrates a flow chart of a method for manufacturing a compound barrier layer according to an embodiment of the disclosure.

FIG. 2 illustrates a flow chart of the method for manufacturing a compound barrier layer according to an embodiment of the disclosure. Referring to FIGS. 1 and 2, in step 202, a substrate 100 is provided. In step 204, a first barrier layer 102 is formed on the substrate 100. In step 206, a second barrier layer 104 is formed on the first barrier layer 102 to form a compound barrier layer with the first barrier layer 102. The first barrier layer 102 and second barrier layer 104 both comprise a plurality of alternately arranged inorganic material regions 106 and organo-silicon material regions 108, and the inorganic material regions 106 and the organo-silicon material regions 108 of the first barrier layer 102 and second barrier layer 104 are alternatively stacked vertically.

Figure 3:
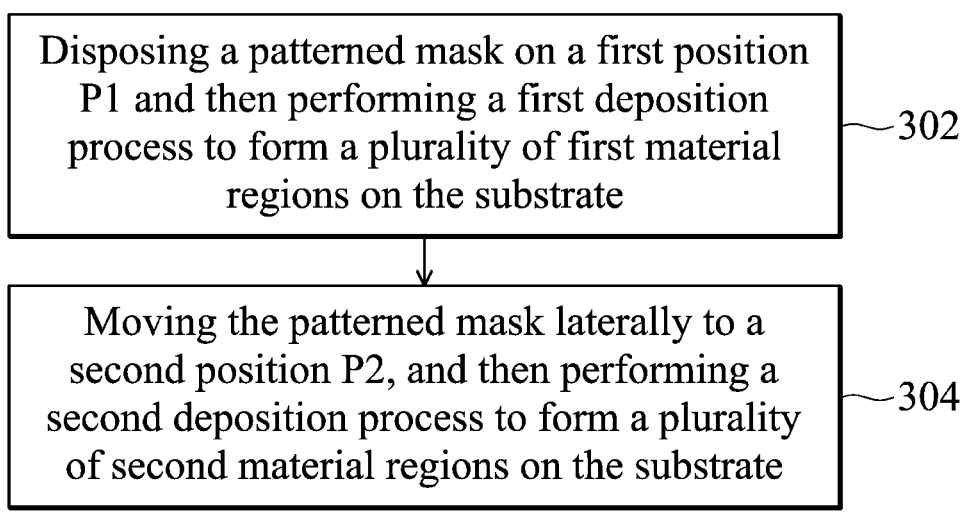
FIG. 3 illustrates a flow chart of the method of forming the first barrier layer in step 204.
Figure 4:
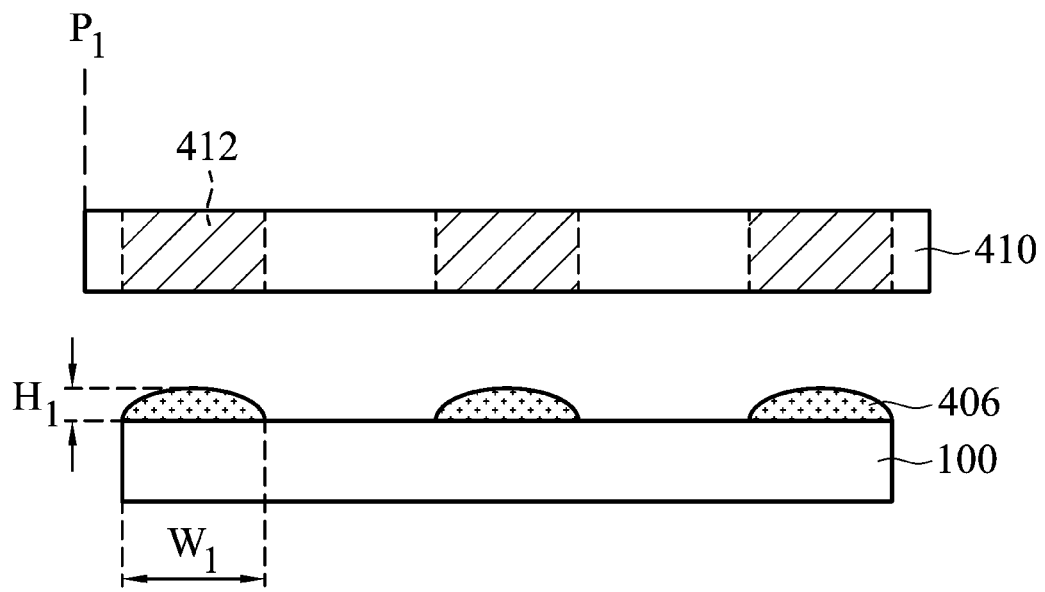
FIGS. 4 and 5 illustrate cross sections of the first barrier layer in each stage according to the method shown in FIG. 3.
Figure 5:
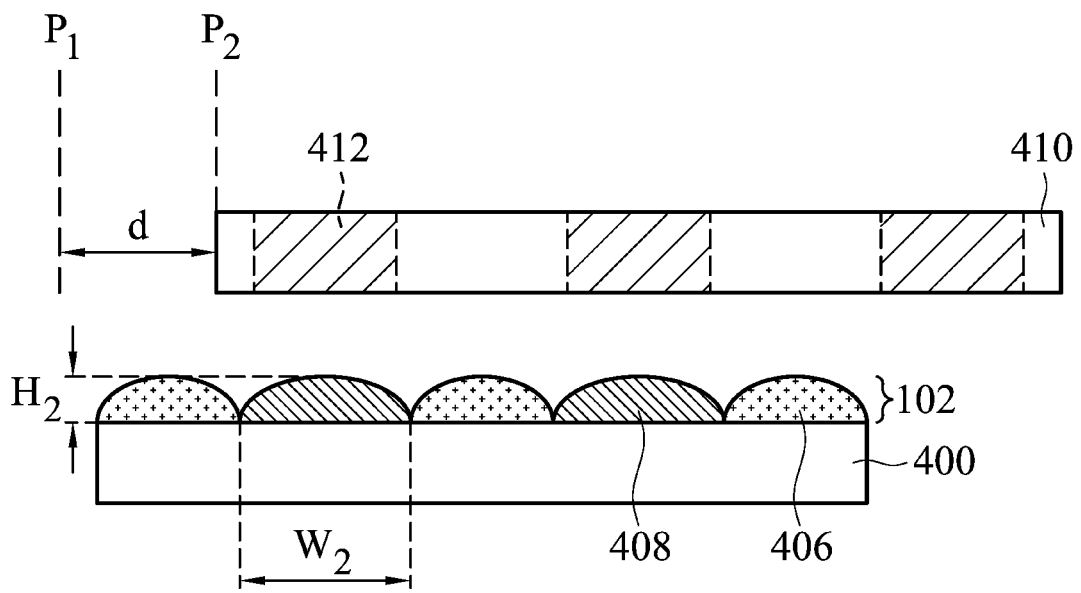
Figure 6:
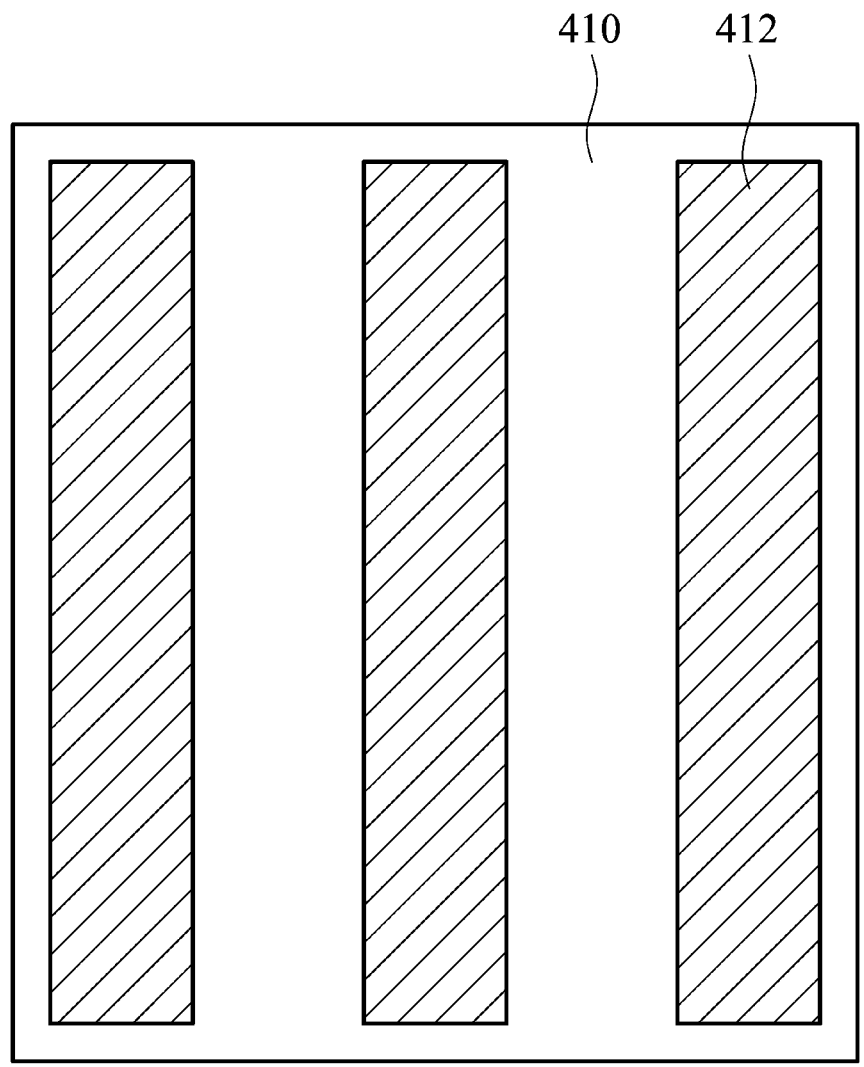
FIGS. 6 and 7 illustrate examples of a patterned mask.
Figure 7:
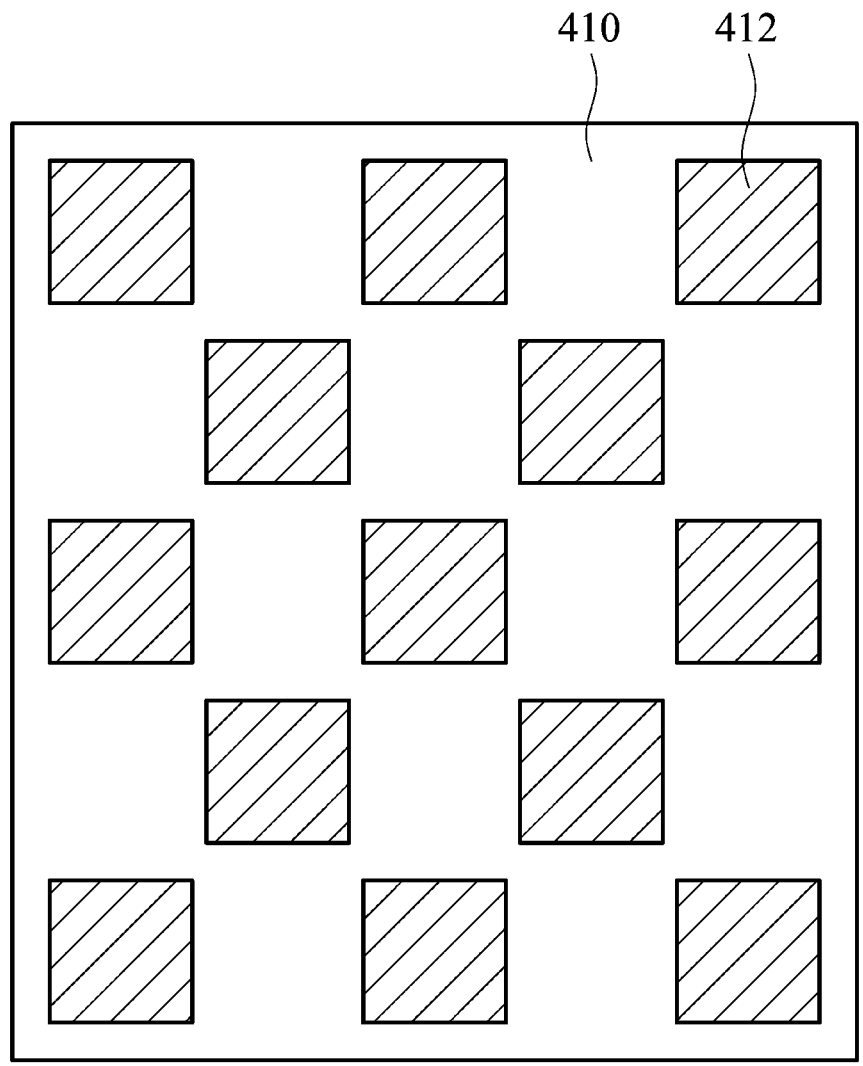

More specifically, FIG. 3 illustrates a flow chart of the method of forming the first barrier layer 102 in step 204. FIGS. 4 and 5 illustrate cross sections of the first barrier layer 102 in each stage according to the method shown in FIG. 3. Referring to FIGS. 3 and 4, in step 302, a patterned mask 410 is disposed at a first position $P_1$ and then a first deposition process is performed to form a plurality of first material regions 406 on the substrate 100. According to an embodiment of the disclosure, the patterned mask 410 has a pattern formed as a one dimension array, as shown in FIG. 6. In another embodiment, the patterned mask 410 has a pattern formed as a two dimension array, as shown in FIG. 7. According to an embodiment of the disclosure, the first material regions 406 are the inorganic material regions 106 shown in FIG. 1. However, it should be understood that the second material regions 408 may be organo-silicon material regions 108 in other embodiments. However, it should be understood that in various embodiments, the first material regions and the second material regions are selected from a group consisting of the inorganic material regions and the organo-silicon material regions, and the first material regions are different from the second material regions. According to an embodiment of the disclosure, the first deposition process is a plasma enhanced chemical vapor deposition (PECVD) process, wherein the plasma power may be between about 200 W and 2000 W or between about 800 W and 1200 W, the reaction gas may be about 1 sccm to 1000 sccm or about 30 sccm to 80 sccm of Ar and about 1 sccm to 1000 sccm or 40 sccm to 80 sccm of oxygen, and operation pressure may be about 1 mtorr to 1000 mtorr or about 1 mtorr to 10 mtorr. In another embodiment, the first deposition process is a plasma enhanced chemical vapor deposition (PECVD) process, wherein the plasma power is between about 1000 W, the reaction gas is about 50 sccm of Ar and about 60 sccm of oxygen, the operation pressure may be about 5 mtorr, and the precursor comprises hexamethyldisiloxane (HMDSO), hexmethyldisilane (HMDS), or tetramethylsilane (TMS). According to an embodiment of the disclosure, each of the first material regions 406 is separated by a distance, for example, between about 0.5 mm to about 20 mm.

In step 304, the patterned mask 410 is moved laterally to a second position $P_2$, and then a second deposition process is performed to form a plurality of second material regions 408 on the substrate 100. In addition, sizes of the second material regions 408 may be adjusted as required by moving the patterned mask 410 closer to or away from the substrate 100. In the present application, the patterned mask 410 is moved away from the substrate 100 to form the second material regions 408, such that a width $W_2$ of the second material regions is larger than a width $W_1$ of the first material regions. In addition, as shown in FIG. 5, the patterned mask 410 is moved laterally by a distance d to the second position $P_2$, such that the second material regions 408 are formed on the portion of the substrate 100 where no first material regions 406 are formed (there may be a little overlap of the first material regions 406 and the second material regions 408). In other words, the first material regions 406 and the second material regions 408 are alternately arranged on the substrate 100. According to an embodiment of the disclosure, the second deposition process is a plasma enhanced chemical vapor deposition (PECVD) process, wherein the plasma power may be between about 200 W and 2000 W or between about 200 W and 600 W, the reaction gas may be about 1 sccm to 1000 sccm or about 10 sccm to 30 sccm of Ar and about 1 sccm to 100 sccm or 1 sccm to 10 sccm of oxygen, and operation pressure may be about 1 mtorr to 1000 mtorr or about 30 mtorr to 60 mtorr. The flow rate of the oxygen in the first deposition process may be less than the flow rate of the oxygen in the second deposition process. In another embodiment, the second deposition process is a plasma enhanced chemical vapor deposition (PECVD) process, wherein the plasma power is between about 400 W, the reaction gas is about 16 sccm of Ar and about 10 sccm of oxygen, operation pressure may be about 40 mtorr; and the precursor comprises hexamethyldisiloxane (HMDSO), hexmethyldisilane (HMDS), or tetramethylsilan (TMS). According to an embodiment of the disclosure, the first deposition process and the second deposition process are performed in a same reaction chamber. In addition, according to an embodiment of the disclosure, the power of the first deposition process is higher than the power of the second deposition process, and a flow rate of oxygen in the first deposition process is higher than a flow rate of oxygen in the second deposition process.

Figure 8:
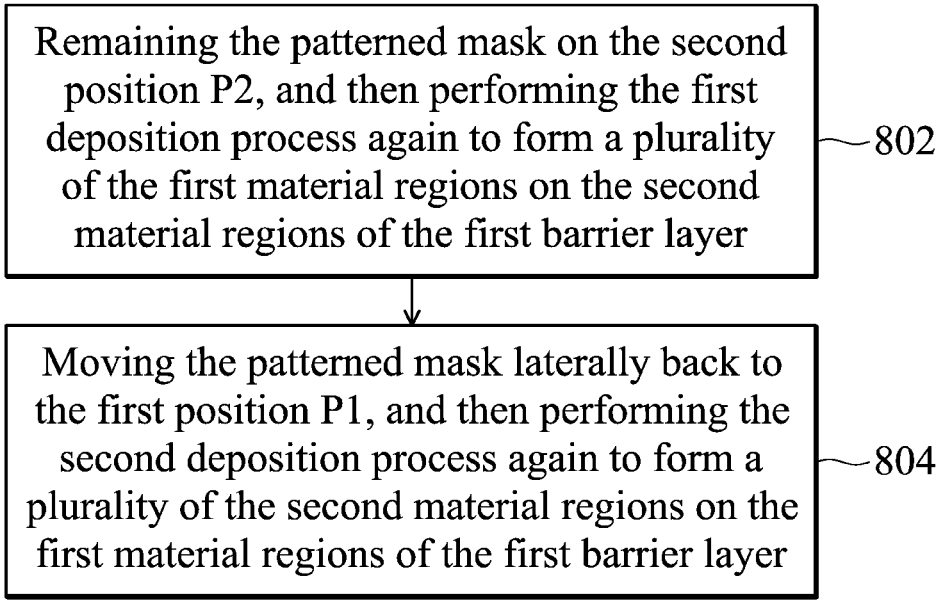
FIG. 8 illustrates a flow chart of a method of forming the second barrier layer of FIG. 2.
Figure 9:
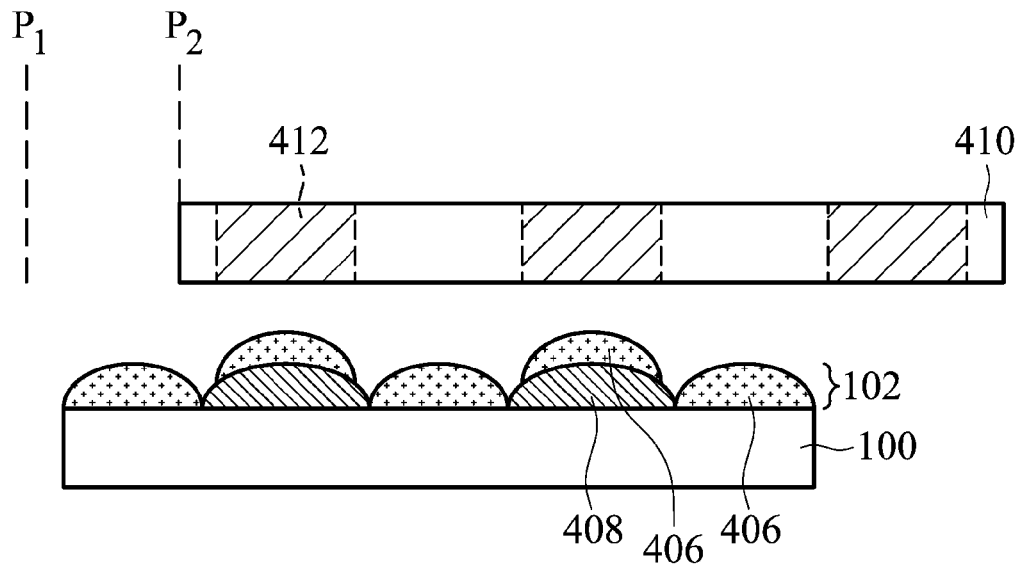
FIGS. 9 and 10 illustrate cross sections of the second barrier layer in each stage according to the method shown in FIG. 8.
Figure 10:
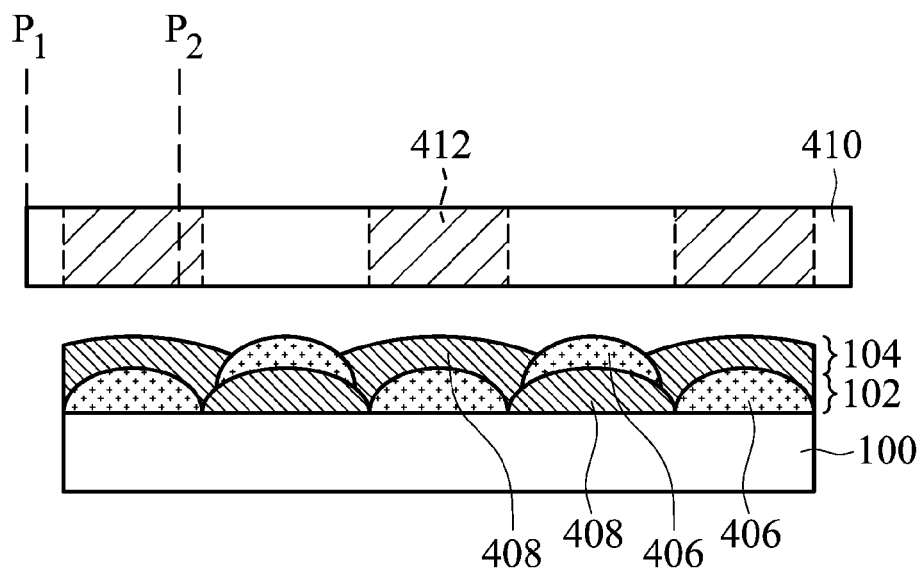

FIG. 8 illustrates a flow chart of a method of forming the second barrier layer in step 206 of FIG. 2. FIGS. 9 and 10 illustrate cross sections of the second barrier layer 104 in each stage according to the method shown in FIG. 8. Referring to FIGS. 8 and 9, in step 802, the patterned mask 410 on the second position $P_2$ is not moved, and then the first deposition process is performed again to form a plurality of the first material regions 406 on the second material regions 408 of the first barrier layer 102. Referring to FIGS. 8 and 10, in step 804, the patterned mask 410 is moved laterally back to the first position $P_1$, and then the second deposition process is performed again to form a plurality of the second material regions 408 on the first material regions 406 of the first barrier layer 102. As shown in FIG. 10, the first material regions 406 and the second material regions 408 of the first barrier layers 102 and second barrier layer 104 are alternatively stacked vertically.

It should be understood, that, in other embodiments, the compound barrier layer may also be formed by performing the second deposition process to form the organo-silicon material regions first. After that, the patterned mask 410 may be moved and then the first deposition process is performed to form the inorganic material regions.

As shown in FIG. 10, in some embodiments, the organo-silicon material regions 408 of the first barrier layer 102 and the second barrier layer 104 are connected to each other to form a continuous structure, and the inorganic material regions 406 of the first barrier layer 102 and the second barrier layer 104 are disconnected with each other to form a discontinuous structure. Therefore, the discontinuous inorganic material regions can prevent the compound barrier layer from breaking when being bent. Meanwhile, the compound barrier layer can still have good water-resistant ability. In addition, the compound barrier layer can be formed in the same apparatus. Therefore, micro-particle contamination can be reduced, processing time spent can be decreased, and higher yields may be achieved.

In other embodiments, the compound barrier layer as shown in FIG. 1 may be formed by other methods. For example, various precursors and/or deposition processes other than PECVD may also be used to form the inorganic material regions and the organo-silicon material regions, respectively.

Figure 11:
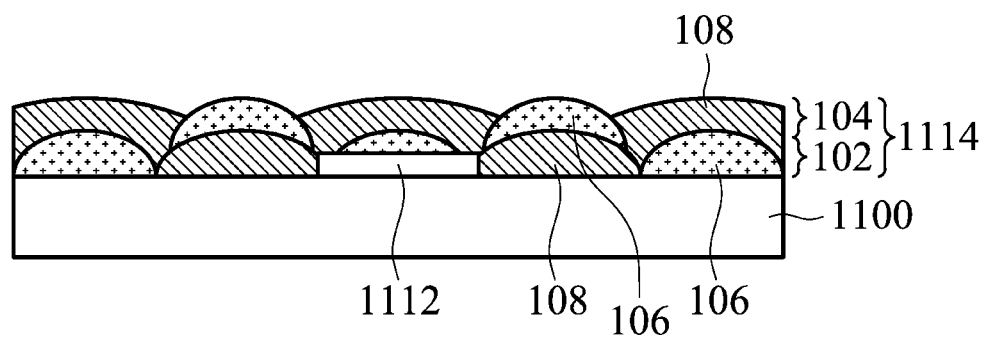
FIG. 11 illustrates a cross section of a package structure containing the compound barrier layer according to an embodiment of the disclosure.

FIG. 11 illustrates a cross section of a package structure containing the compound barrier layer according to an embodiment of the disclosure. Referring to FIG. 11, the package structure containing the compound barrier layer comprises a substrate 1100, an electronic device 1112, and a compound barrier layer 1114. The electronic device 1112 is disposed on the substrate 1100, and the compound barrier layer 1114 is disposed on the electronic device 1112. The compound barrier layer 1114 comprises: a first barrier layer 102 disposed on the electronic device 1112; and a second barrier layer 104 disposed on the first barrier layer 102.

In this embodiment, the substrate 1100 may be a rigid substrate, for example, a glass substrate. Since this kind of substrate has water-resistant ability, the compound barrier layer 1114 may be required to be disposed on the top of the electronic device 1112 to prevent water penetration into the electronic device.

Figure 12:
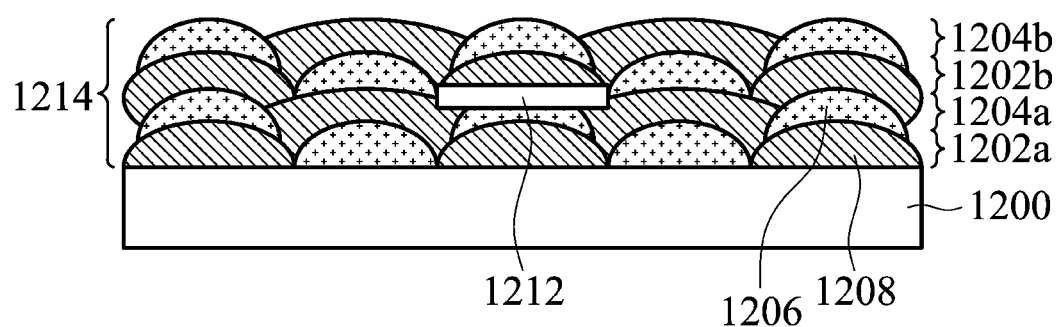
FIG. 12 illustrates a cross section of a package structure containing the compound barrier layer according to another embodiment of the disclosure.

FIG. 12 illustrates a cross section of a package structure containing the compound barrier layer according to another embodiment of the disclosure. Referring to FIG. 12, the package structure containing the compound barrier layer comprises a substrate 1200, an electronic device 1212, and a compound barrier layer 1214. In this embodiment, the compound barrier layer 1214 is disposed on the electronic device 1212 and between the substrate 1200 and the electronic device 1212, such that the electronic device 1212 is completely surrounded by the compound barrier layer 1214. More specifically, the compound barrier layer 1214 may comprise a first barrier layer 1202a and a second barrier layer 1204a under the electronic device 1212, and a first barrier layer 1202b and a second barrier layer 1204b on top of the electronic device 1212. As shown in FIG. 12, all of the first barrier layer 1202a, the second barrier layer 1204a, the first barrier layer 1202b, and the second barrier layer 1204b comprise a plurality of alternately arranged inorganic material regions 1206 and organo-silicon material regions 1208, and the inorganic material regions 1206 and the organo-silicon material regions 1208 are alternatively stacked vertically.

In this embodiment, the substrate 1200 may be a flexible substrate, such as a poly(ethylene terephthalate) (PET) substrate, a polyethersulfones (PES) substrate, a poly(ethylene 2,6-naphthalate) (PEN) substrate, a polyimide (PI) substrate, or a polycarbonate (PC) substrate. In addition, the electronic device 1212 may be a flexible electronic device, such as an organic light emitting device (OLED), an electro-phoretic display (EPD), or a thin film solar cell. In general, the flexible substrate maybe not prevent water from penetrating into the device effectively. Therefore, the compound barrier layer 1214 may be required to be formed between the electronic device 1212 and the substrate 1200 to isolate the electronic device 1212. Since the electronic device 1212 is completely surrounded by the compound barrier layer 1214, water penetration via the substrate can be prevented.

Figure 13:
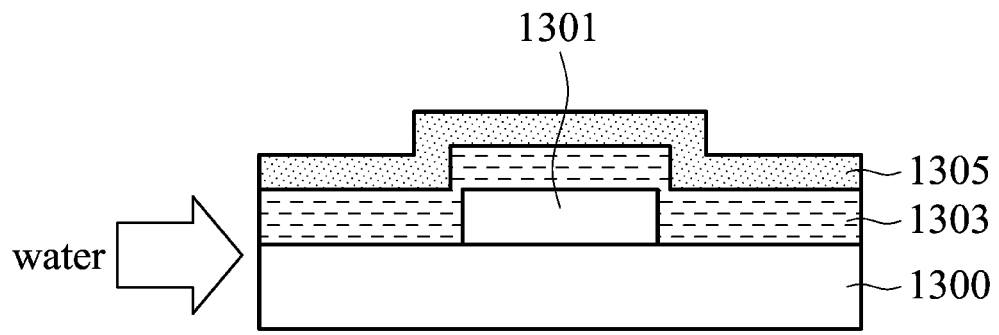
FIG. 13 illustrates a cross section of a package structure according to one comparative example.

Conventionally, inorganic material is deposited on the flexible electronic device directly. However, since the expansion and compression ability of the inorganic material is limited, the inorganic layer tends to disengage from the device due to inner stress. In addition, although it may be possible to form an electronic device 1301, an organic material layer 1303, and an inorganic material layer 1305 sequentially on the substrate 1300 (as shown in FIG. 13) such that the organic material layer 1303 may be used as a buffer layer to release the inner stress, the organic/inorganic (such as polymer layer/metal oxide layer) multilayer stacking structure may still have poor water-resistant ability and the inorganic layer may break when being bent.

Figure 14:
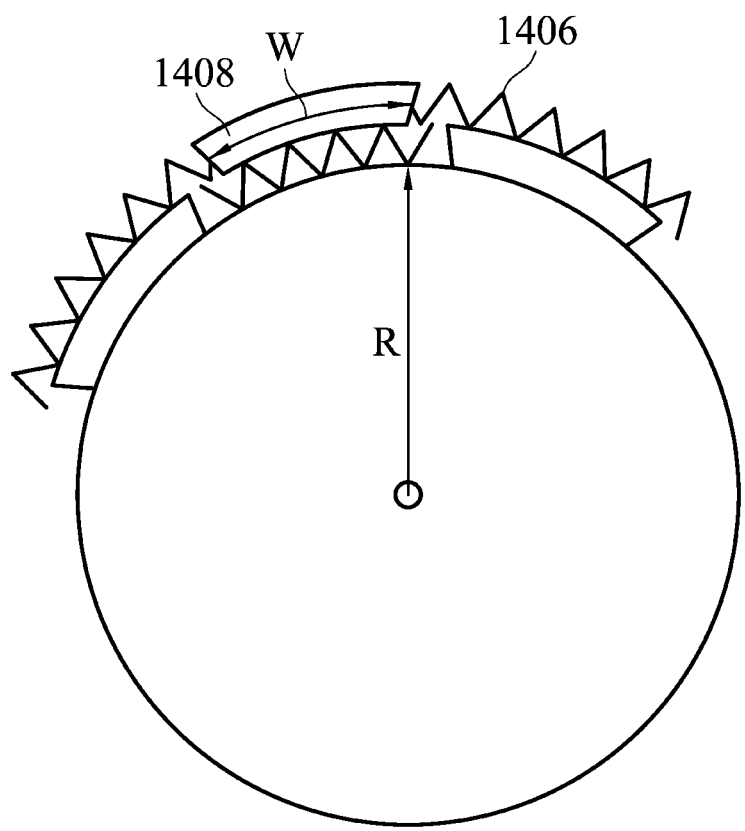
FIG. 14 illustrates a drawing of a compound barrier layer when being bent according to an embodiment of the disclosure.

On the other hand, the compound barrier layer may be used in a highly flexible device according to an embodiment of the disclosure. FIG. 14 illustrates a drawing of a compound barrier layer when being bent according to an embodiment of the disclosure. As shown in FIG. 14, when the inorganic material regions 1406 are connected to organo-silicon material regions 1408, the organo-silicon material regions 1408 may be used as a buffer layer to prevent the inorganic material regions 1406 from breaking. According to an embodiment of the disclosure, the patterned mask may be designed such that a width W of the inorganic material region is smaller than a curvature radius R of the device. In this case, damage to the inorganic material regions 1406 may be minimized. According to an embodiment of the disclosure, the water-resistant rate of the compound barrier layer is only decreased by 2% after curving for 10000 times.

In addition, by stacking the inorganic material regions and the organo-silicon material regions alternatively in the compound barrier layer, water penetration can be prevented (even at the side surfaces). Moreover, since the organo-silicon material also has water-resistant ability, the water-resistant ability of the compound barrier layer may not be undermined. Therefore, when the compound barrier layer is used in a flexible package structure, the lifetime of the soft electronic devices made therefrom can be increased.

According to an embodiment of the disclosure, all the formation processes of the compound barrier layer are performed in the same chamber by adjusting the mask position, reaction gas flow rate, plasma power, or other conditions. Therefore, the processing time can be decreased, and the device can have good water-resistant ability.

COMPARATIVE EXAMPLE 1

Forming Continuous Organic/Inorganic Barrier Layer

First, a precursor, hexamethyldisiloxane ($C_6H_{18}Si_2O$, HMDSO) was heated. Next, Ar was used to bring the volatile HMDSO into a PECVD chamber. The deposition process was performed under low plasma power with Ar and oxygen to form an organo-silicon material layer (plasma power: 400 W; reaction gas: 16 sccm of Ar and less than 10 sccm of oxygen; working pressure: 40 mtorr). Since the plasma power was low with less oxygen input, the resulting material contained a great amount of undissolved Si and $CH_3$ bonds. Therefore, the resulting organo-silicon material layer was formed (including organic compounds having an Si—C bond or Si—O—C bond, wherein organic compounds having an Si—C bond includes organo-silicon compounds having an Si—($CH_3$) bond, Si—($CH_2$) bond, or Si—(CH) bond). The organo-silicon material film was formed on the substrate. The organo-silicon material film was used as a buffer layer and was a continuous layer.

Then, Ar and a higher amount of oxygen were used to bring the volatile HMDSO into a PECVD chamber (plasma power: 1000 W; reaction gas: 50 sccm of Ar and 60 sccm of oxygen; working pressure: 5 mtorr).

The heated HMDSO gas was dissolved by the plasma in the chamber. At this stage, the plasma broke the weaker C—H bond of the HMDSO and it reacted with the oxygen in the chamber to form inorganic $SiO_2$. The inorganic material layer was formed on the organo-silicon material layer. A continuous organic/inorganic barrier layer was formed.

EXAMPLE 1

Forming a Compound Barrier Layer (1) Forming Inorganic Material Regions of First Barrier Layer:

First, a precursor, hexamethyldisiloxane ($C_6H_{18}Si_2O$, HMDSO) was heated. Next, Ar was used to bring the volatile HMDSO into a PECVD chamber (plasma power: 1000 W; reaction gas: 50 sccm of Ar and 60 sccm of oxygen; working pressure: 5 mtorr). Oxygen was used as a reaction gas and the heated HMDSO gas was dissolved by the plasma in the chamber. At this stage, the plasma broke the weaker C—H bond of the HMDSO and it reacted with the oxygen in the chamber to form inorganic $SiO_2$. The inorganic $SiO_2$ was deposited on a first regions defined by a patterned mask. The separated inorganic material regions were formed on the substrate.

(2) Forming Organo-Silicon Material Regions of the First Barrier Layer:

After the inorganic material regions of the first barrier layer were formed, the patterned mask was moved by a distance d. The deposition process was performed under low plasma power with less oxygen used to form the organo-silicon material regions (plasma power: 400 W; reaction gas: 16 sccm of Ar and less than 10 sccm of oxygen; working pressure: 40 mtorr). Since the plasma power was low with less oxygen input, the resulting material contained a great amount of undissolved Si and $CH_3$ bonds. Therefore, the resulting organo-silicon material regions were formed (including organic compounds having an Si—C bond or Si—O—C bond, wherein organic compounds having an Si—C bond includes organo-silicon compounds having an Si—($CH_3$) bond, Si—($CH_2$) bond, or Si—(CH) bond). The organo-silicon material regions and the inorganic material regions formed the first barrier layer.

(3) Forming Inorganic Material Regions of a Second Barrier Layer:

After forming the first barrier layer, the patterned mask remained at its position but the deposition condition was adjusted to be the same as that of the condition used in step (1). Inorganic material regions were formed again on the organo-silicon material regions of the first barrier layer.

(4) Forming Organo-Silicon Material Regions of the Second Barrier Layer:

After forming the inorganic material regions of the second barrier layer, the patterned mask was moved by a distance d, back to the position in step (1). Then, the deposition condition was adjusted to be the same as that of the condition used in step (2). Organo-silicon material regions were formed again on the inorganic material regions of the first barrier layer. A compound barrier layer was formed, wherein the compound barrier layer comprised the discontinuous inorganic material regions and the organo-silicon material regions.

(5) Water Vapor Transmission Rate:

The resulting compound barrier layer was tested by an analysis instrument MOCON to perform a water-resistant ability test, wherein the water vapor transmission rate (WVTR) of the compound barrier layer reached the detection limit of the instrument at about $10^{-3}$ g/m²/day.

(6) Water Vapor Transmission Rate (Ca Test):

In a Ca test, Ca was used to test for water because Ca reacts with water to form CaO. The formation of CaO was observed by a microscope. The formation of the CaO can be presented with the following formula:

$$Ca(s)+H_2O(l) \rightarrow CaO(s)+H_2(g) \quad (1\text{-}1);$$

$$CaO(s)+H_2O(l) \rightarrow Ca(OH)_2(s) \quad (1\text{-}2); \text{ and}$$

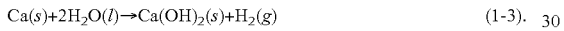
$$Ca(s)+2H_2O(l) \rightarrow Ca(OH)_2(s)+H_2(g) \quad (1\text{-}3).$$

According to formula (1-1) and (1-2), the Ca metal film was oxidized by water in the atmosphere to form a CaO. Then, the CaO film was oxidized again with water in the atmosphere to form Ca(OH)₂ (as shown in formula (1-3). The total content of water in the film was calculated according to the molecular weight of Ca (40 g/mole), density of Ca (1.54 g/cm³, at 20° C.), and the molecular weight of water (18 g/mole). The size of the oxidation portion of the Ca film was observed by a microscope and analyzed by image analysis. The WVTR of the compound barrier layer was about $10^{-6}$ g/cm²/day.

(7) Bending Test:

Bending tests were performed to the continuous organic/inorganic barrier layer in comparative example 1 and the compound barrier layer in example 1. The curvature radius was 10 mm. The result was observed by an SEM. According to the observations, there were cracks on the continuous organic/inorganic barrier layer, wherein water and oxygen may penetrate therethrough. Therefore, the continuous organic/inorganic barrier layer in the comparative example 1 had a low water-resistant/oxygen-resistant ability.

On the other hand, the compound barrier layer in example 1 showed no cracks even under 5000 times magnifying power. In other words, the water-resistant/oxygen-resistant ability of the compound barrier layer in example 1 did not decrease after the bending test.

(8) Water Vapor Transmission Rate after the Bending Test:

In order to analyze the reliability of the compound barrier layer on a flexible plastic material, the WTVR before the bending test ($W_0$) and the WTVR after the bending test (W) were detected. A WTVR changing rate was defined with the following equation:

$$WVTR(\%) = \frac{(W - W_0)}{W_0} \times 100\%.$$

Figure 15:
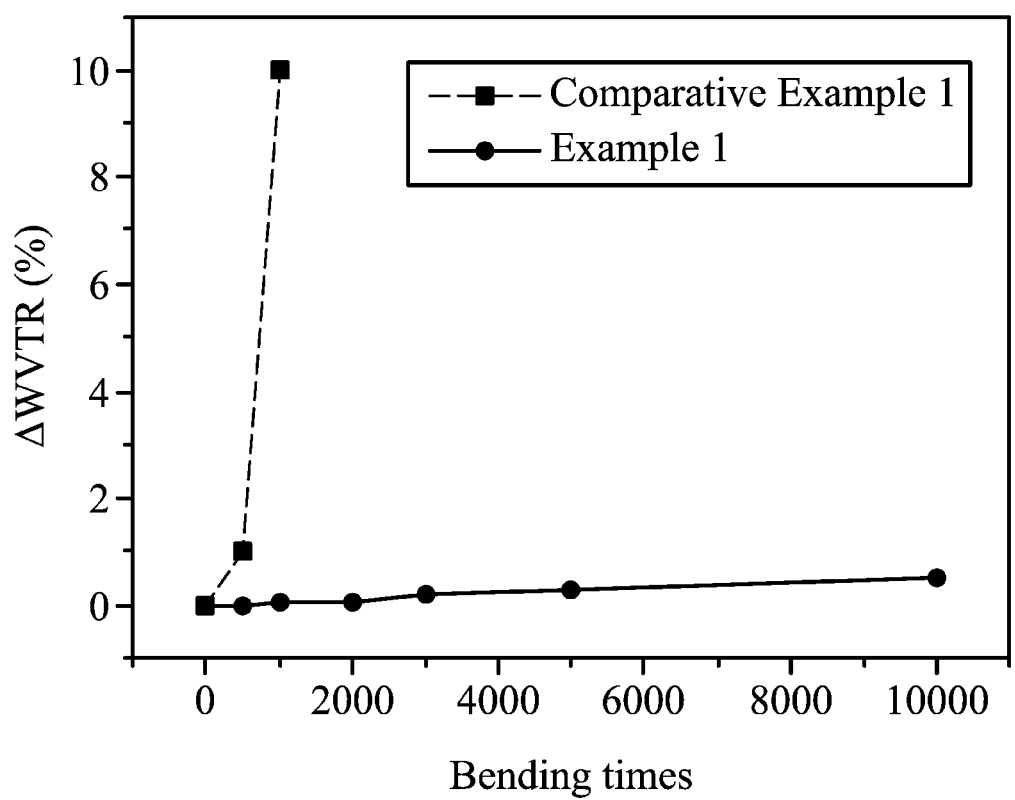
FIG. 15 shows the WTVR changing rate (WVTR %) in one example.

When the curvature radius was 10 mm, the bending tests were performed for 0, 500, 1000, 2000, 3000, 5000, and 10000 times (total weight: 0.5 kg; testing speed: 100 mm/min). The WTVR changing rate (WVTR %) is shown in FIG. 15. As shown in FIG. 15, the WTVR changing rate of the compound barrier layer in example 1 remained between ±2%. In other words, the compound barrier layer in example 1 passed the reliability test (curvature radius: 100 mm; bending for 10000 times). However, the continuous organic/inorganic barrier layer in comparative example 1 had a WTVR changing rate about 10% when bending for 1000 times.

According to the experiments, the compound barrier layer had high water-resistant ability and oxygen-resistant ability, whether it was on a highly flexible substrate or not.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A compound barrier layer, comprising
a first barrier layer disposed on a substrate; and
a second barrier layer disposed on the first barrier layer, wherein the first barrier layer and second barrier layer both comprise a plurality of alternately arranged inorganic material regions and organo-silicon material regions, wherein the inorganic material regions of the first barrier layer and the organo-silicon material regions of the second barrier layer are alternatively stacked vertically, and the inorganic material regions of the second barrier layer and the organo-silicon material regions of the first barrier layer are alternatively stacked vertically, wherein the organo-silicon material regions of the first barrier layer and the second barrier layer are connected to each other to form a continuous structure, and the inorganic material regions of the first barrier layer and the second barrier layer are disconnected with each other to form a discontinuous structure.

2. The compound barrier layer as claimed in claim 1, wherein the organic material regions comprise compounds having an Si—C bond or Si—O—C bond.

3. The compound barrier layer as claimed in claim 1, wherein the inorganic material regions comprise aluminum oxide (Al₂O₃), silicon oxide, silicon oxynitride, silicon nitride, silicon-carbon-oxy-nitride, or combinations thereof.

4. A package structure containing a compound barrier layer, comprising
a substrate;
an electronic device disposed on the substrate; and
a first compound barrier layer disposed on the electronic device, wherein the first compound barrier layer comprises:
a first barrier layer disposed on the electronic device; and
a second barrier layer disposed on the first barrier layer, wherein the first barrier layer and second barrier layer both comprise a plurality of alternately arranged inorganic material regions and organo-silicon material regions, wherein the inorganic material regions of the first barrier layer and the organo-silicon material regions of the second barrier layer are alternatively stacked vertically, and the inorganic material regions of the second barrier layer and the organo-silicon material regions of the first barrier layer are alternatively stacked vertically, wherein the organo-silicon material regions of the first barrier layer and the second barrier layer are connected to each other to form a continuous structure, and the inorganic material regions of the first barrier layer and the second barrier layer are disconnected with each other to form a discontinuous structure.

5. The package structure containing a compound barrier layer as claimed in claim 4, wherein the substrate is a flexible substrate, and the electronic device is a flexible electronic device.

6. The package structure containing a compound barrier layer as claimed in claim 5, wherein the electronic device comprises an organic light emitting device (OLED), an electro-phoretic display (EPD), or a thin film solar cell.

7. The package structure containing a compound barrier layer as claimed in claim 4, wherein the organic material regions comprise compounds having an Si—C bond or an Si—O—C bond.

8. The package structure containing a compound barrier layer as claimed in claim 4, wherein the inorganic material regions comprise aluminum oxide ($Al_2O_3$), silicon oxide, silicon oxynitride, silicon nitride, silicon-carbon-oxy-nitride, or combinations thereof.

9. The package structure containing a compound barrier layer as claimed in claim 4, further comprising a second compound barrier layer disposed between the substrate and the electronic device, such that the electronic device is surrounded by the first compound barrier layer and the second compound barrier layer, and the second compound barrier layer comprises:
    a third barrier layer disposed on the electronic device; and
    a fourth barrier layer disposed on the third barrier layer, wherein the third barrier layer and fourth barrier layer both comprise a plurality of alternately arranged inorganic material regions and organo-silicon material regions, wherein the inorganic material regions of the third barrier layer and the organo-silicon material regions of the fourth barrier layer are alternatively stacked vertically, and the inorganic material regions of the fourth barrier layer and the organo-silicon material regions of the third barrier layer are alternatively stacked vertically.

10. A method for manufacturing a compound barrier layer, comprising
    providing a substrate;
    forming a first barrier layer on the substrate; and
    forming a second barrier layer on the first barrier layer, wherein the first barrier layer and the second barrier layer both comprise a plurality of alternately arranged inorganic material regions and organo-silicon material regions, wherein the inorganic material regions of the first barrier layer and the organo-silicon material regions of the second barrier layer are alternatively stacked vertically, and the inorganic material regions of the second barrier layer and the organo-silicon material regions of the first barrier layer are alternatively stacked vertically, wherein the organo-silicon material regions of the first barrier layer and the second barrier layer are connected to each other to form a continuous structure, and the inorganic material regions of the first barrier layer and the second barrier layer are disconnected with each other to form a discontinuous structure.

11. The method for manufacturing a compound barrier layer as claimed in claim 10, wherein the organic material regions comprise compounds having an Si—C bond or an Si—O—C bond.

12. The method for manufacturing a compound barrier layer as claimed in claim 10, wherein the inorganic material regions comprise aluminum oxide ($Al_2O_3$), silicon oxide, silicon oxynitride, silicon nitride, silicon-carbon-oxy-nitride, or combinations thereof.

13. The method for manufacturing a compound barrier layer as claimed in claim 10, wherein the step of forming the first barrier layer comprises:
    disposing a patterned mask at a first position and then performing a first deposition process to form a plurality of first material regions on the substrate, and
    moving the patterned mask laterally to a second position and then performing a second deposition process to form a plurality of second material regions on the substrate, wherein the first material regions and the second material regions are selected from a group consisting of the inorganic material regions and the organo-silicon material regions, and the first material regions are different from the second material regions.

14. The method for manufacturing a compound barrier layer as claimed in claim 13, wherein the step of forming the second barrier layer comprises:
    remaining the patterned mask at the second position, and then performing the first deposition process to form a plurality of the first material regions on the second material regions of the first barrier layer, and
    moving the patterned mask laterally to the first position, and then performing the second deposition process to form a plurality of the second material regions on the first material regions of the first barrier layer, such that the first material regions and the second material regions of the first barrier layer and second barrier layer are alternatively stacked vertically.

15. The method for manufacturing a compound barrier layer as claimed in claim 13, wherein the first deposition process and the second deposition process are plasma enhanced chemical vapor deposition (PECVD) processes.

16. The method for manufacturing a compound barrier layer as claimed in claim 15, wherein the first deposition process and the second deposition process are performed in a same reaction chamber, and power of the first deposition process is higher than power of the second deposition process, and a flow rate of oxygen in the first deposition process is higher than a flow rate of oxygen in the second deposition process.

17. The method for manufacturing a compound barrier layer as claimed in claim 13, wherein the patterned mask has a pattern formed as a one dimension array.

18. The method for manufacturing a compound barrier layer as claimed in claim 13, wherein the patterned mask has a pattern formed as a two dimension array.

19. The method for manufacturing a compound barrier layer as claimed in claim 13, wherein the first deposition process and the second deposition process comprise using a same precursor, and the precursor comprises hexamethyldisiloxane (HMDSO), hexmethyldisilane (HMDS), or tetramethylsilane (TMS).

* * * * *